United States Patent [19]

Buehler

[11] Patent Number: 4,719,411

[45] Date of Patent: Jan. 12, 1988

[54] ADDRESSABLE TEST MATRIX FOR MEASURING ANALOG TRANSFER CHARACTERISTICS OF TEST ELEMENTS USED FOR INTEGRATED PROCESS CONTROL AND DEVICE EVALUATION

[75] Inventor: Martin G. Buehler, La Canada, Calif.

[73] Assignee: California Institute of Technology, Pasadena, Calif.

[21] Appl. No.: 733,110

[22] Filed: May 13, 1985

[51] Int. Cl.⁴ .............................................. G01R 31/28
[52] U.S. Cl. .............................. 324/73 R; 324/158 R; 324/158 T; 371/25; 371/21
[58] Field of Search .......... 29/574; 324/73 R, 73 AT, 324/158 R, 158 T; 371/25, 24

[56] References Cited

U.S. PATENT DOCUMENTS

| 3,810,301 | 5/1974 | Cook | 29/574 |
| 3,940,740 | 2/1976 | Coontz | 29/574 |
| 3,961,252 | 6/1976 | Eichelberger | 324/73 AT |
| 4,055,754 | 10/1977 | Chesley | 324/73 R X |
| 4,243,937 | 1/1981 | Multani et al. | 324/158 T |
| 4,479,088 | 10/1984 | Stopper | 324/73 R |
| 4,587,480 | 5/1986 | Zasio | 324/73 R |
| 4,607,219 | 8/1986 | Isosaka | 324/158 R |

OTHER PUBLICATIONS

Buehler; "Comprehensive Test Patterns with Modular Test Structures: The 2 by N Probe Pad Array Approach"; Solid State Technology; Oct. 1979, pp. 89-94.

Buehler et al.; "Role of Test Chips in Coordinating Logic and Circuit Design and Layout Aids for VLSI"; Solid State Technology; Dec. 1981, pp. 68-74.

Henderson et al.; "Integrated Circuit Test Structure Which Uses a Vernier to Electrically Measure Mask Misalignment"; Electronics Letters; Oct. 13, 1981; vol. 19, No. 21; pp. 868-869.

Primary Examiner—Ernest F. Karlsen
Assistant Examiner—Vinh P. Nguyen
Attorney, Agent, or Firm—Freilich, Hornbaker, Rosen & Fernandez

[57] ABSTRACT

A set of addressable test structures, each of which uses addressing schemes to access individual elements of the structure in a matrix, is used to test the quality of a wafer before integrated circuits produced thereon are diced, packaged and subjected to final testing. The electrical characteristic of each element is checked and compared to the electrical characteristic of all other like elements in the matrix. The effectiveness of the addressable test matrix is in readily analyzing the electrical characteristics of the test elements and in providing diagnostic information.

3 Claims, 9 Drawing Figures

LOCATION OF OPEN CONTACTS

COLUMN

|   | 1 | 2 | 3 | 4 | 5 |
|---|---|---|---|---|---|
| 8 |  | 6 9<br>4 8 |  | 3 6<br>4 8 |  |
| 7 | 1 7<br>2 5 10 11<br>3 6 9<br>4 8 | 1 7<br>2 5 10 11<br>3 6 9<br>4 8 | 4 8 | 1 7<br>2 5 10 11<br>3 6 9<br>4 8 | 2<br>3 6<br>4 8 |
| 6 | 1 7<br>2 5 10 11<br>3 6 9<br>4 8 | 1 7<br>2 5 10 11<br>3 6 9<br>4 8 | 1 7<br>2 5 10 11<br>3 6 9<br>4 8 | 1 7<br>2 5 10 11<br>3 6 9<br>4 8 | 1 7<br>2 5 10 11<br>3 6 9<br>4 8 |
| 5 | 1 7<br>2 5 10 11<br>3 6 9<br>4 8 | 1 7<br>2 5 10 11<br>3 6 9<br>4 8 | 1 7<br>2 5 10 11<br>3 6 9<br>4 8 | 1 7<br>2 5 10 11<br>3 6 9<br>4 8 | 1 7<br>2 5 10 11<br>3 6<br>4 |
| 4 |  | 7 | 1 7<br>2 5 10 11<br>3 6 9<br>4 | 1 7<br>2 5 10 11<br>3 6 9 |  |

Legend:
| 1 | 7 | |
|---|---|---|
| 2 5 | 10 11 | |
| 3 6 | 9 | |
| 4 | 8 | |

FIG. 7

INVERTER PARAMETERS

COLUMN

|   | 1 | 2 | 3 | 4 | 5 |
|---|---|---|---|---|---|
| 8 | 2.3   17<br>0.0   5.0 | 4.4   30<br>(4.4)  5.0 | 2.3   17<br>0.0   5.0 | 4.5   4.0<br>(1.7)  5.0 | 2.3   17<br>0.0   5.0 |
| 7 | 2.3   0.1<br>0.0   (0.0) | 1.7   4.1<br>(1.6)  (2.7) | 2.3   18<br>(0.6)  5.0 | 1.4   0.5<br>(0.2)  (0.2) | 2.3   0.1<br>0.0   (0.0) |
| 6 | 2.3   0.0<br>0.0   (0.0) | 1.7   4.2<br>(1.6)  (2.7) | 2.2   0.1<br>(0.2)  (0.2) | 1.6   0.5<br>(0.2)  (0.2) | 2.3   0.1<br>0.0   (0.0) |
| 5 | 2.3   0.0<br>0.0   (0.0) | 1.7   14<br>(1.6)  (2.7) | 2.2   0.1<br>(0.2)  (0.2) | 1.8   0.4<br>(0.2)  (0.2) | 2.3   0.1<br>0.0   (0.0) |
| 4 | 2.3   17<br>0.0   5.0 | 2.3   17<br>0.0   5.0 | 2.3   0.2<br>(0.1)  (0.1) | 2.1   0.6<br>(0.1)  (0.1) | 2.3   17<br>0.0   5.0 |

Legend:
| $V_{INV}$ | GAIN |
|---|---|
| VLOW | VHIGH |

FIG. 8

ADDRESSABLE TEST MATRIX FOR MEASURING ANALOG TRANSFER CHARACTERISTICS OF TEST ELEMENTS USED FOR INTEGRATED PROCESS CONTROL AND DEVICE EVALUATION

ORIGIN OF INVENTION

The invention described herein was made in the performance of work under a NASA contract, and is subject to the provisions of Public Law 96-517 (35 USC 202) in which the Contractor has elected to retain title.

BACKGROUND OF THE INVENTION

This invention relates to a method for testing integrated circuit (IC) wafers for quality control of the process, and initial screening of IC devices prior to dicing and packaging the individual devices.

The use of microelectronic test structures for process characterization in IC fabrication is now common, usually in the form of inverters interspersed among the devices. Yet these structures often consume a lot of area on wafers and are considered an automatic yield loss. Concern about this area is a long standing one that has limited their use. In more recent times the shift from whole-wafer-lithography to direct-step-on-wafer lithography has placed further emphasis on the efficient utilization of wafer area for diagnostic purposes.

Test chips can be "pad intensive" where each test element in a test structure (such as a transistor) is connected to a separate probe pad. This approach to test chip layout has the advantage of eliminating the interference of one structure on another. The disadvantage of this approach is that only a limited number of structures can be sampled so that it may be difficult to establish a meaningful characterization of device parameters and process faults.

OBJECTS AND SUMMARY OF THE INVENTION

An object of this invention is to develop a set of addressable test structures, each of which uses addressing schemes to access individual elements of the structure in a matrix. In a preferred embodiment the structure is an addressable CMOS inverter matrix that allows the signal transfer characteristics of elements in the matrix to be recorded for comparison. The test elements may consist of inverters, but the elements could be transistors, diodes or other integrated circuit devices, including contacts. The circuit characteristic of each element is checked and compared to the characteristic of all other like elements in the matrix. The effectiveness of the addressable test matrix is in analyzing the characteristics of the test elements and in providing diagnostic information.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 2a illustrates details of a preferred embodiment of the inverter matrix shown in FIG. 1.

FIG. 2b illustrates details of an inverter and transmission gate shown in FIG. 2a.

FIG. 7 illustrates in a chart the location of open contacts in a portion of the addressable inverter matrix. The numbers refer to the contacts as labeled in FIG. 6.

FIG. 8 illustrates in a chart inverter parameters for the same portion of the addressable inverter matrix shown in FIG. 7. Faulty VLOW and VHIGH values are circled.

DESCRIPTION OF PREFERRED EMBODIMENTS

Figure 1A:
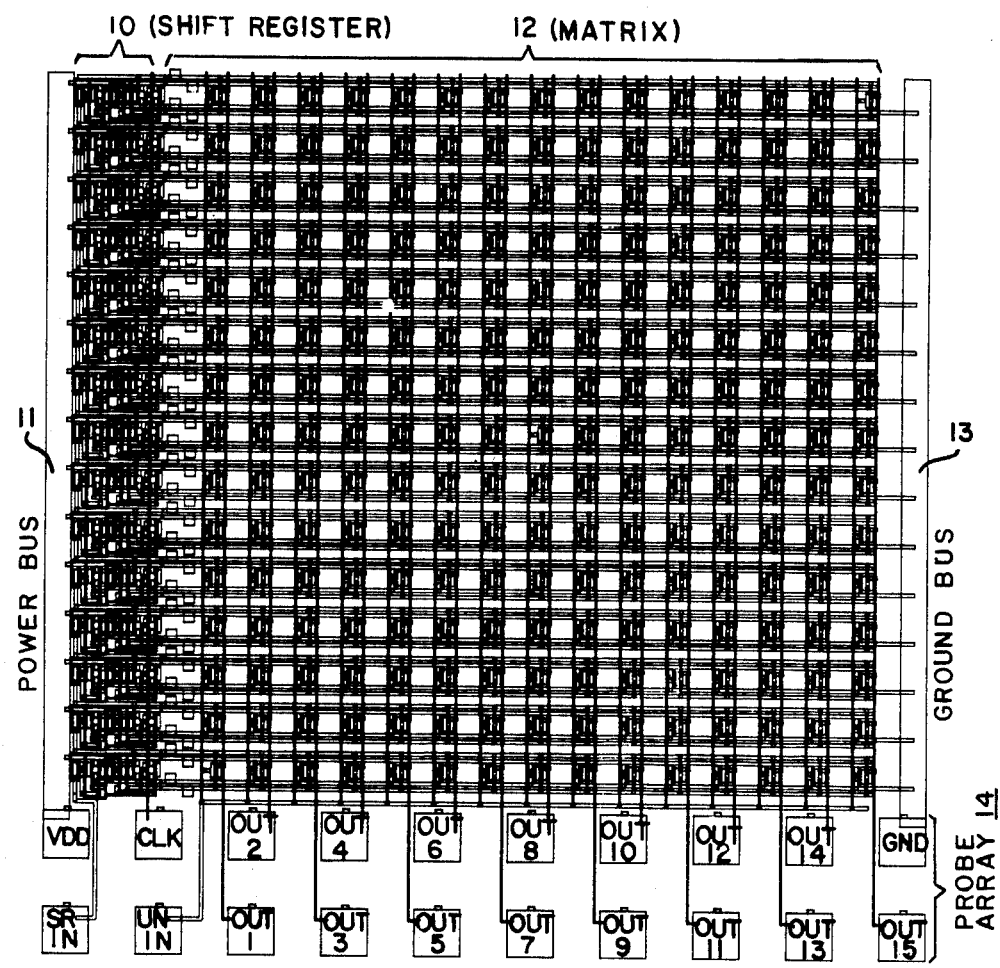
FIG. 1a illustrates an addressable test matrix in accordance with this invention.
Figure 1B:
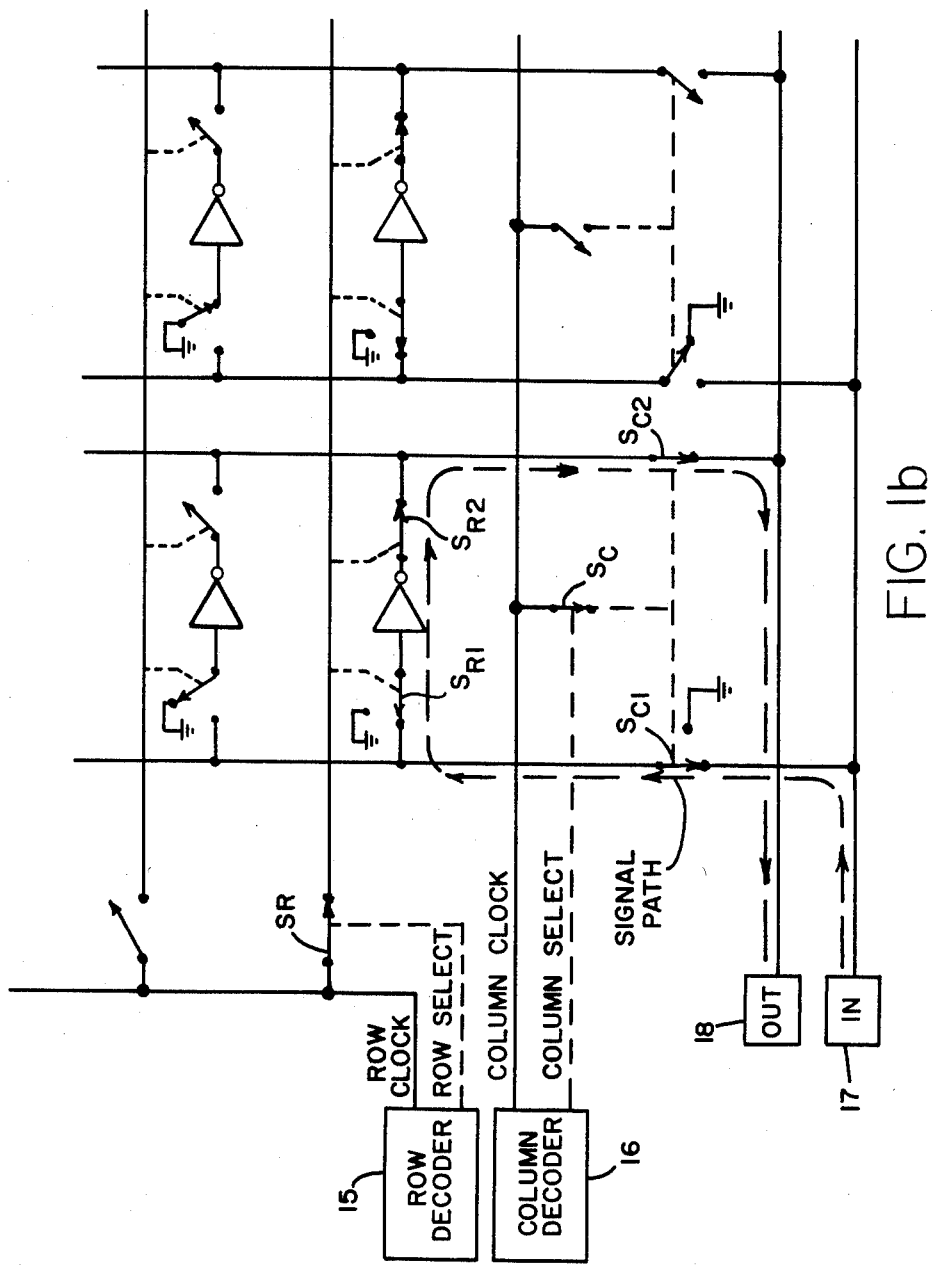
FIG. 1b illustrates a more general approach to implementation of the addressing means for the matrix.

A test structure fabricated on an IC wafer in accordance with this invention is shown in FIG. 1a. It consists of a shift register 10 on the left side of the structure, a power bus 11, a 15×15 matrix 12 of 222 inverter-transmission gate cells and three reference sites connected to a ground bus 13 and a 2×10 probe array 14. The structure is confined to a square area that is 1.6-mm on a side. This layout allows this structure to be combined with other structures on an IC chip that are probeable with the same probe array. A more general approach is illustrated in FIG. 1b.

Figure 2:
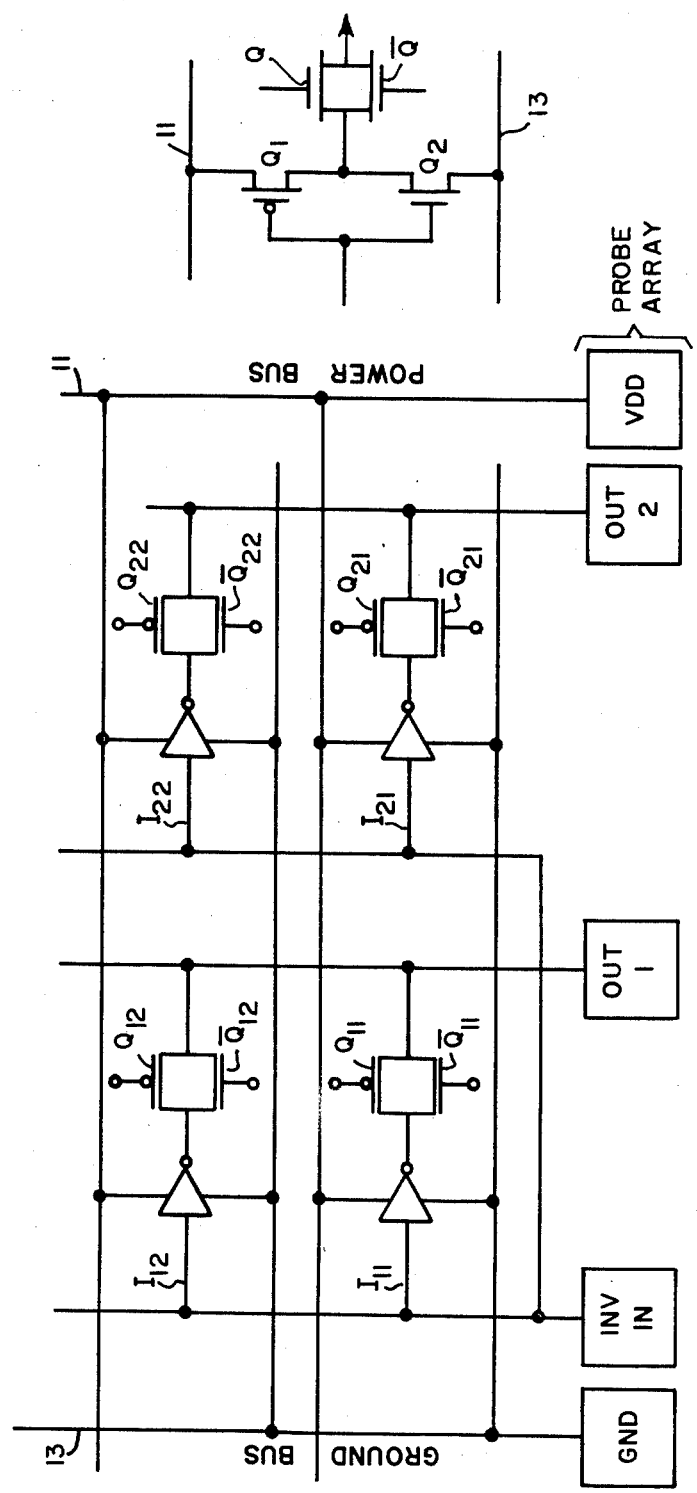

Details of the matrix are shown in FIG. 2a where it is seen that all the inputs of inverters $I_{NM}$ are connected to the structure input labels INV IN. The subscripts N and M designate column and row respectively in the matrix addressing system; what is shown is the first two columns (1 and 2) and the first two rows (1 and 2). The inverter outputs are connected to row-addressable cMOS transmission gates, each comprised of a pMOS transistor in parallel with an nMOS transistor. Both transistors of a cMOS gate are driven together. The transmission gates are connected to column busses that terminate at the probe pads labeled INV OUT with numbers corresponding to the columns.

An inverter shown in FIG. 2b is comprised of a pMOS transistor $Q_1$ in series with an nMOS transistor $Q_2$ connected between $V_{dd}$ on the power bus and the ground bus. The power supply ($V_{dd}$) bus 11 and the ground bus 13 are shown explicitly in FIG. 2b to illustrate that each inverter has the same low series resistance in its power lines.

The shift register 10 is used to turn on a row of transmission gates by providing a proper bias to transistors Q and $\overline{Q}$. It is a conventional static cMOS shift register that uses inverters and transmission gates in a master-slave D-flip flop configuration, or any other arrangement of bistable stages in a shift register configuration. However, it should be understood that the shift register functions only to address the rows; consequently, it should be appreciated that other addressing means may be used for the same function, such as a decoder having a 4-bit input to select one of the fifteen rows.

Figure 3:
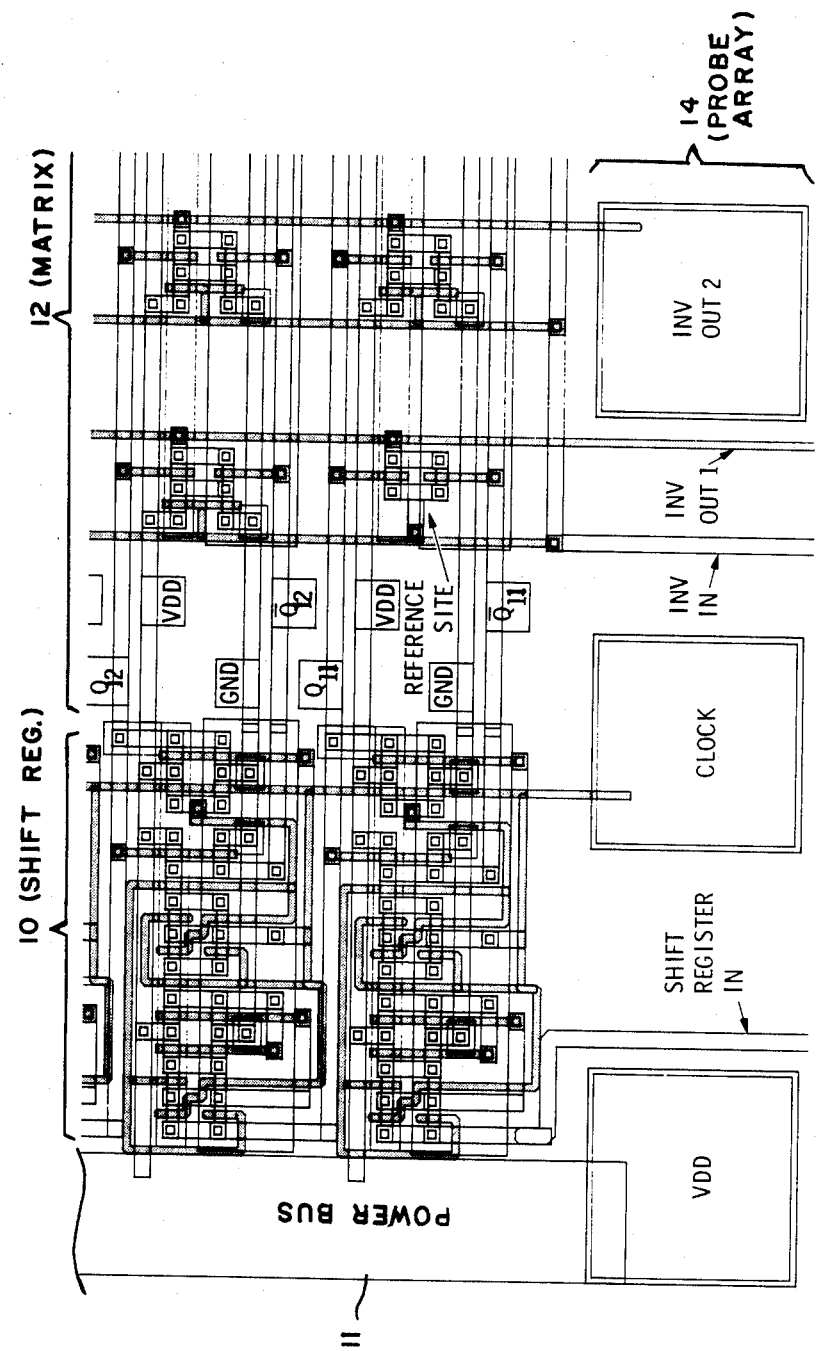
FIG. 3 is an enlarged view of the lower left corner of the inverter matrix of FIG. 1a showing a reference site.

In order to verify the operation of the shift register, three reference sites are introduced at the lower left, middle, and upper right of the matrix. A reference site can be seen in FIG. 3 at the position for the inverter $I_{1,1}$.

In these reference sites the inverters are omitted and the input to the transmission gate are connected directly to the structure input. When measurements are made at these sites, the output voltage is expected to equal the input voltage for good devices. These sites thus serve as markers to check that the shift register has advanced from row 1 to rows 8 and 15. The location and number of reference sites can be altered to suit the measurement requirements.

The structure was fabricated in a 3-$\mu$m cMOS bulk p-well self-aligned poly-gate isoplanar process. The inverters were designed with gate features of $Wp/Lp=6.0/3.0$ for the p-channel pull-up transistor and $Wn/Ln=4.5/3.0$ for the n-channel pull-down transistors where the dimensions are in micrometers.

Referring to FIG. 1b, the most general approach to addressing a test matrix would use row and column decoders 15 and 16 that would select one inverter at a time by closing a selected row-select switch $S_R$ which in turn closes switches $S_{R1}$ and $S_{R2}$, and a column-select switch $S_C$, which in turn closes switches $S_{C1}$ and $S_{C2}$, thus providing a current path through the selected inverter. In implementation of this general approach, each inverter may be a cMOS inverter and each switch shown schematically as a single pole switch may be a cMOS switch of the configurations shown in FIG. 2b. Each switch shown as a single pole, double throw switch may include an additional nMOS transistor having one terminal connected to ground and the other terminal connected to a node common to the transistors of the cMOS switch and its gate connected to the gate of pMOS transistor of the cMOS switch. In operation, the row and column decoders 15, 16 turn on only one inverter at a time by connecting its input to an input contact pad 17 and its output to an output contact pad 18. A programmed microcomputer (FIG. 4) then causes a test signal to be applied and an output signal to be displayed and/or recorded. The necessary switching through lines from the decoders is illustrated schematically. Note that when a row select switch $S_R$ is closed switches $S_{R1}$ and $S_{R2}$ of every inverter are switched to the position alternate to the one shown and that a particular inverter in the column is selected by a column select switch $S_C$ which in turn closes switches $S_{C1}$ and $S_{C2}$. The select switches $S_R$ and $S_C$ are shown in the closed (addressed) condition. Signals through those closed switches then operate the other switches $S_{R1}$, $S_{R2}$ and $S_{C1}$, $S_{C2}$.

TEST EQUIPMENT AND TEST PROGRAM

Figure 4:
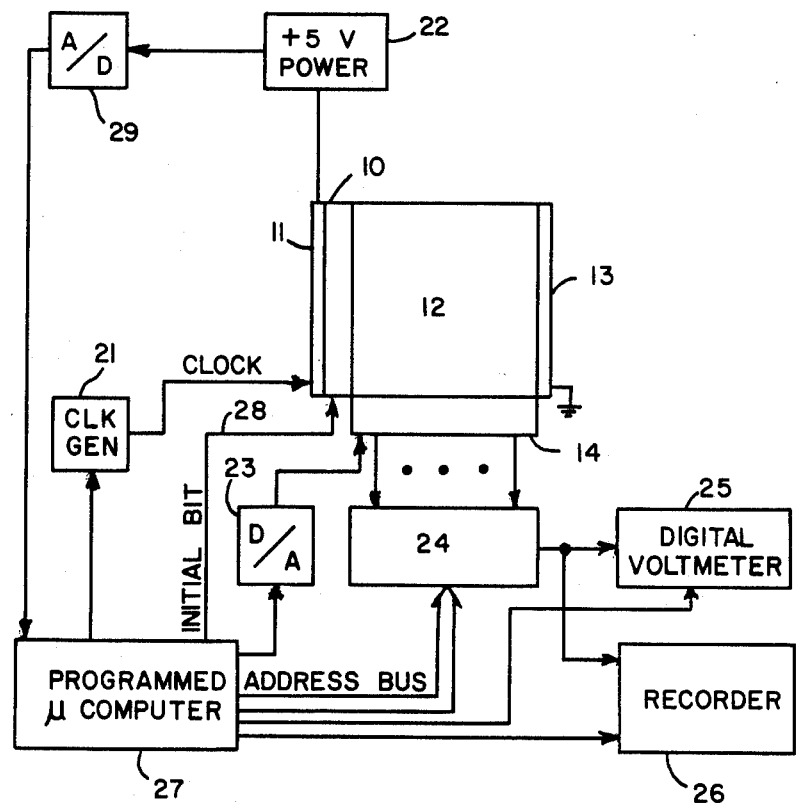
FIG. 4 illustrates a block diagram of equipment used in testing IC wafers in accordance with this invention.

The test equipment shown in FIG. 4 consists of the following instruments: a clock 21 for pulsing the shift register or row decoder, a 5-volt power supply 22, a digital-to-analog converter 23 with 0.5 millivolt resolution for generating inverter input voltages the output of which is taken through an addressable switch matrix 24 to a digital voltmeter 25 with 10 gigaohms input impedance and 100 microvolt resolution for measuring inverter outputs and to a recorder 26. These instruments are controlled by a programmed microcomputer 27 which generates an initial bit over line 28 to initiate the addressing function of the shift register by entering a bit 1 to be shifted through in addressing the matrix row by row.

A test program was developed to test the matrix which consists of 15 rows and 15 columns of inverter-transmission gate cells. The shift register is used to select the row to be tested; however, before this can be done the shift register must be cleared since it is in an unknown state when power is first applied. After clearing, a row is selected via the word generator, as by clocking a pulse through the shift register to select one of the 15 rows, or causing the word generator to produce a 4-bit addressing word to be decoded in addressing one of fifteen rows.

In order to avoid taking faulty data, the program monitors the power supply voltage via an A/D converter 29 before taking each data point. The program will flag the data if the power supply voltage drops below 4.75 volts. The power supply is current limited to about 20 mA to protect the probe card against excessively large current surges.

The structure is measured in two modes. When complete transfer characteristic curves are desired, the input voltage is stepped in increments of 0.1 volts and the output voltage recorded. In order to characterize inverters quickly, a five-voltage measurement is performed. From the inverter output voltages we determine VHIGH, VLOW, VINV, and GAIN. VLOW is measured at the inverter output for a high input. VHIGH is measured at the inverter output for a low input. VINV is determined by connecting the output of the inverter to its input and measuring the resulting voltage, termed the inverter threshold voltage. The GAIN is the magnitude of the slope of the inverter transfer curve in the vicinity of VINV. The GAIN is determined from two inverter output voltage measurements. In one measurement the inverter input is forced to 25 millivolts less than VINV and in the other the voltage is forced to 25 millivolts greater than VINV. The GAIN is the magnitude of the difference between the resulting voltages divided by 50 millivolts.

The data is taken in a sequence which is designed to minimize the switching of the tester's switch matrix. First VINV is measured at each cell along a specific column. Then GAIN, VLOW, and VHIGH are measured for each cell in a column. The sequence is not important for good cells but becomes important for faulty cells. For faulty cells the results can be test sequence and time dependent because these cells can have transistors that may be stuck on, stuck off, or leak.

Results from two good inverter matrices are listed in Table 1.

TABLE 1

| | TEST RESULTS FROM TWO GOOD INVERTER MATRICES. | |
|---|---|---|
| | MEAN +/− PERCENT STANDARD DEVIATION | |
| PARAMETER (UNITS) | RUN A (Loc 3,4) | RUN B (Loc 3,5) |
| VHIGH (V) | 5.00+/−1E-4 | 5.00+/−1E-4 |
| VLOW (V) | 7E-6+/−137 | 1E-5+/−369 |
| VINV (V) | 1.96+/−0.58 | 2.19+/−0.71 |
| GAIN | 22.6+/−2.224 | 12.9+/−2.74 |
| NOISE MARGIN (V) | 1.87+/−0.57 | 2.02+/−0.72 |

From the VHIGH and VLOW values, it is seen that the inverter outputs are at VDD for VHIGH and at ground for VLOW. It is also seen that the VINV and GAIN values are tightly distributed. Note that the standard deviation for the VLOW values are habitually very large because the calculation requires the standard deviation to be divided by the mean which in this case is very close to zero. As seen in the table, the standard deviation for VINV is less than one percent and for GAIN is less than 3 percent. By combining VINV and GAIN, the noise margin was calculated from the following equation which was derived using the maximum square approach and piece-wise linear approximation to the transfer curve:

NOISE MARGIN=(1−1/GAIN))VINV

The noise margin values listed in Table 1 are well above the worst case noise margin of 25 percent of VDD or 1.25 volts.

Results from four inverter matrices with undersized pull-down transistor widths are listed in Table 2.

TABLE 2

| TEST RESULTS FROM FOUR FAULTY INVERTER MATRICES. | | | | |
|---|---|---|---|---|
| PARAMETER | MEAN +/− PERCENT STANDARD DEVIATION | | | |
| (UNITS) | LOCATION 2,6 | LOCATION 5,6 | LOCATION 8,6 | LOCATION 11,6 |
| VHIGH (V) | 5.00+/−0.006 | 5.00+/−0.021 | 4.96+/−0.17 | 5.00+/−0.008 |
| VLOW (V) | 0.37+/−292 | 1E-5+/−186 | 0.02+/−1051 | 2E-3+/−325 |
| VINV (V) | 3.11+/−17.21 | 2.69+/−6.68 | 2.54+/−7.89 | 2.55+/−1.15 |
| GAIN | 19.7+/−79.22 | 7.95+/−13.0 | 9.27+/−7.16 | 11.7+/−3.68 |
| NOISE MARGIN (V) | 1.79+/−28.62 | 2.02+/−8.01 | 2.19+/−8.18 | 2.24+/−1.23 |

Figure 5:
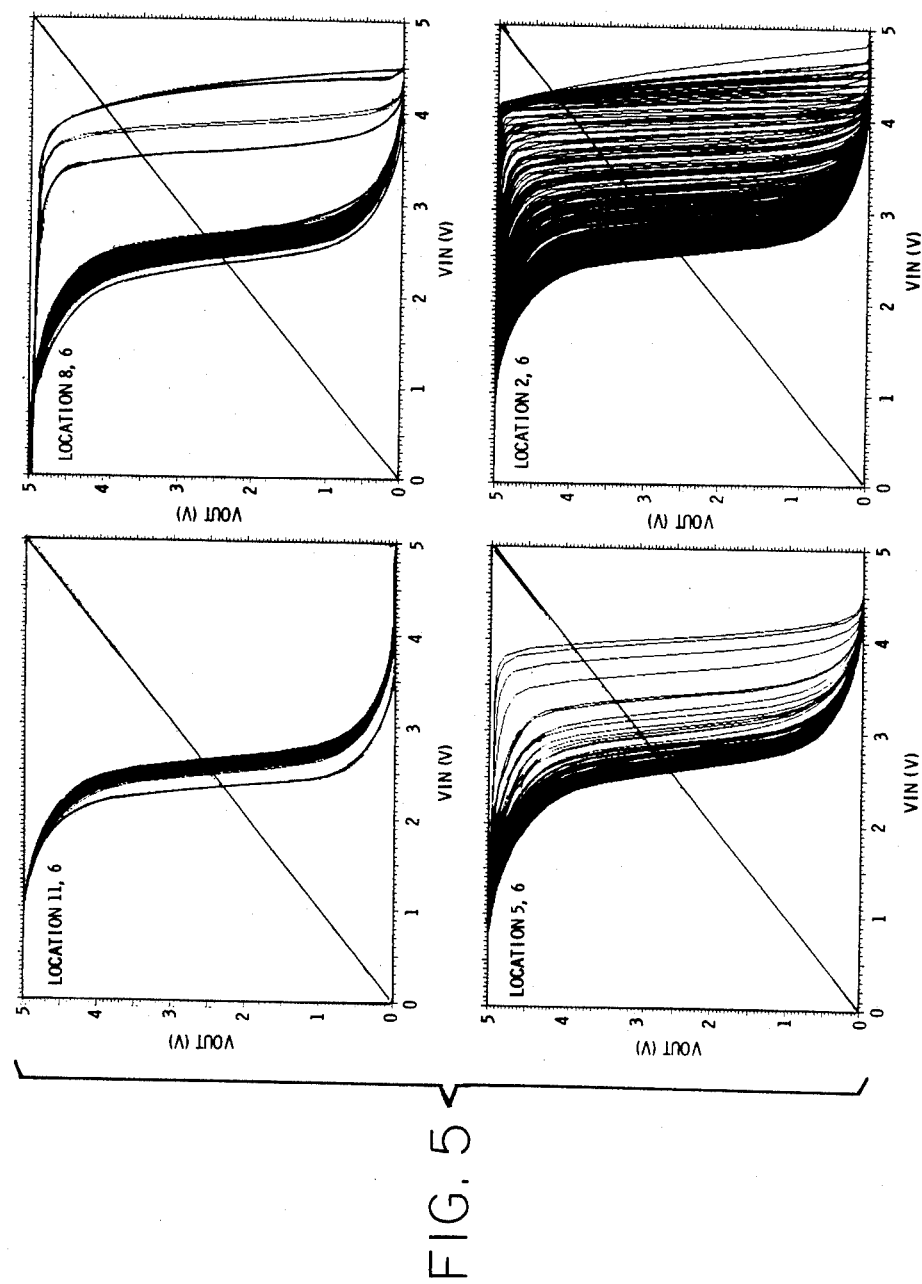
FIG. 5 illustrates four graphs A, B, C and D of inverter transfer curves taken from four addressable inverter matrices located at four sites on a wafer.

These results were obtained at four locations across the diameter of a 4-inch diameter wafer. The wafer had 13 chips across its diameter. It is apparent from the large standard deviations in VINV and GAIN that the inverter transfer curves are not as tightly distributed as those listed in Table 1. A closer examination of the data reveals that the percent standard deviation in VINV, GAIN, and NOISE MARGIN 11.6. A further clarification is shown in the graphs of FIG. 5 where the transfer characteristic curves for each indicated location is shown. The locations of the out-of-conformance curves were found to be randomly distributed throughout each matrix.

This behavior can be explained by variations in the width of the pull-down transistor. This width was designed to be fabricated at the minimum layout rule width. After fabrication the diffusion width was much smaller than the minimum layout rule as determined by split-cross-bridge resistor measurements. Instead of being at the layout rule width of 4.5 m, the average width for this wafer was 1.16+/−0.10 m. The trends seen in FIG. 5 can be explained by the dependence of VINV on Wn. The expression for the inverter threshold voltage is:

$$VINV = \frac{VDD + VTnSQR(Bo) - |VTp|}{1 + SQR(Bo)} \quad (2)$$

where VTn is the n-channel threshold voltage, $|VTp|$ is the magnitude of the p-channel transistor threshold voltage, and $$Bo = (KnWn/Ln)/(KpWp/Lp). \quad (3)$$

kn and kp are the n- and p-channel transistor conduction factors (sometime called KPRIME), Wn and Wp are the n- and p-transistor gate widths, and Ln and Lp are the n- and p-channel transistor gate lengths. In the limit as Wn goes to zero, the inverter threshold voltage becomes:

$$VINV = VDD - |VTp|. \quad (4)$$

For the inverters used in this study, $|VTp|$ was 0.98+/−0.02 volts and VTn was 0.98+/−0.10 volts. For a VDD of 5 volts, VINV can be expected to reach 4 volts and this is the trend observed in FIG. 5, especially for a test matrix at location 2,6 the curves of which are shown in graph D. Note that $|VTp|$ is approximately given by the point where the transfer curve just rises above the VOUT=0 line.

Figure 6:
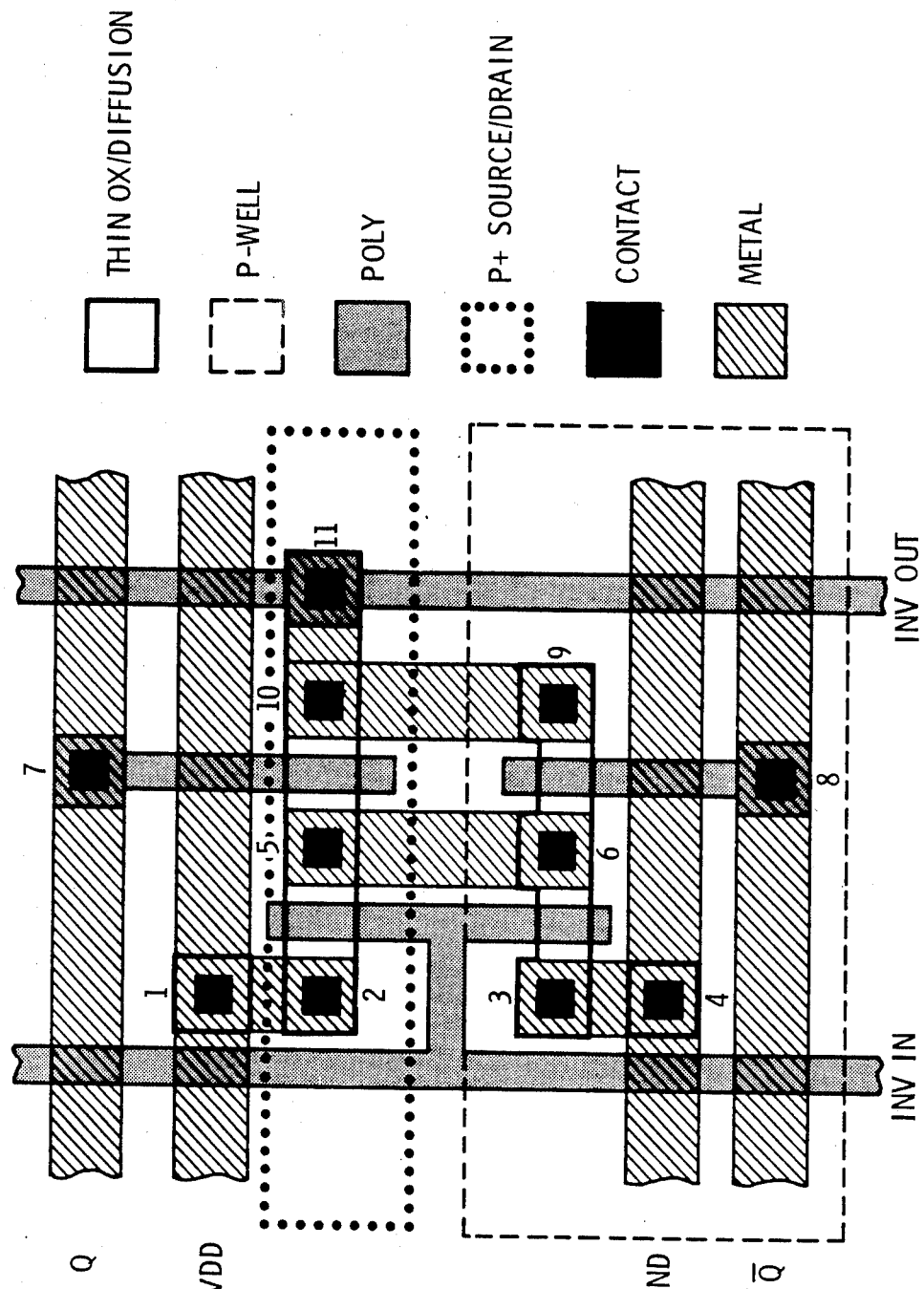
FIG. 6 illustrates the layout of an inverter-transmission gate cell showing the location of eleven contacts indicated by solid black areas.

The occurrence of open contacts can be observed using the addressable inverter matrix. Open contacts can occur at any or all of the contacts in the inverter-transmission gate cell shown in FIG. 6.

The locations of open contacts for the matrix under study is shown in FIG. 7. This list was determined from photomicrographs of each cell. The corresponding inverter parameters, for the cells shown in FIG. 7, are given in FIG. 8 where faulty VLOW and VHIGH values are circled. For this study a fault was defined as VLOW greater than 0.0 volts and VHIGH less than 5.0 volts. The faults observed in this study either prevented the cell from pulling up to VDD or down to GND or both.

An analysis of the inverter-transmission gate cell with singly occurring open contacts is given in Table 3.

TABLE 3

| INVERTER-TRANSMISSION GATE OUTPUT FOR OPEN CONTACTS | | |
|---|---|---|
| OPEN CONTACT AT CONTACT NO. | OUTPUT VLOW | OUTPUT VHIGH |
| NONE | 0 | VDD |
| 2 | $\underline{0}$ | $\overline{Q}$ |
| 3 | $\overline{Q}$ | VDD |
| 5 OR 6 | 0 | VDD |
| 7 (ON) | 0 | VDD |
| 7 (OFF) AND/OR 10 | 0 | VDD−$|VT_p|$ |
| 8 (ON) | 0 | VDD |
| 8 (OFF) AND/OR 9 | VTn | VDD |
| 11 | $\overline{Q}$ | $\overline{Q}$ |

In the table, open contacts at #1 (substrate) and #4 (well) were omitted because other cells in a given row are connected to these layers. Thus the likelihood of having no contact to these layers in a given row was considered remote.

When certain contacts are open, a cell's apparent output will be determined by the previous state of the output bus. For such cases, the state of the output bus is denoted $\overline{Q}$.

As seen in Table 3 an open contact at contact #2, #3, and #11 can lead to a $\overline{Q}$ state. The value of $\overline{Q}$ is determined by the test sequence. In this study the test sequence begins with the measurement of VINV at each cell in a column. Then the GAIN, VLOW, and VHIGH are measured at each cell starting at the bottom of the column and progressing to the top of the column. Before testing the next cell up the column, the input to the cell under test is biased to a high state, which leaves the output bus in a low state.

The results shown in FIG. 8, column 1, can be explained by realizing that since the good cell at 1,4 leaves the output bus in a low state, the cells at 1,5 1,6 and 1,7, which have an open #11 contact, are unable to pull the output bus high. A similar situation holds in column 5 for cells 5,5 and 5,6. The cell at 5,7 is connected to the output bus but an open #2 contact prevents this cell from pulling the output high and so the output remains low.

If the #7 or #8 contact is open, the transmission gate will not be fully functional. These open contacts lead to floating gate transistors which are modeled as being in a conducting (ON) state or a nonconducting (OFF) state. Our data is best explained if we assume that for an open #7 contact, the p-channel transistor is stuck on and for an open #8 contact, the n-channel transistor is stuck off. An open #7 contact occurred at cell 2,4. Under the assumption that the p-channel transistor in the transmission gate is stuck on, the open #7 contact is undetected in evaluating cell 2,4. An open #8 contact occurred at cell 3,7. The assumption that the n-channel transistor in the transmission gate is stuck off explains the observation that this cell only pulls down to within $V_{Tn}$ of GND.

The results for cells 3,4 3,5 3,6 4,4 4,5 4,6 and 4,7 are nearly identical. They can be explained by the leakage of current onto the output bus through leaky p-channel transistors in those transmission gates found in good cells connected to the output bus. This result was confirmed by closely examining the VLOW and VHIGH values. These values slowly drifted upwards as measurements were taken up the column indicating the leakage of current onto the output bus. The results for cells at 2,5 2,6 2,7 2,8 and 4,8 are difficult to explain and remain under study.

At the outset, it was noted that the ancillary circuitry must also be analyzed for faults. In this case, faults in the shift register and the transmission gates must be identified. The three referenced sites are used to verify that the shift register has advanced to rows 1, 8, and 15. The transfer curves for the transmission gates at these sites can be seen in FIG. 5 as a 45 degree line (INV OUT-=INV IN). We have observed metal shorts in the shift register that prevent the propagation of the signal through the shift register. Faulty transmission gates have been observed and these give rise to low GAIN values for the inverter-transmission gate cell.

Although the elements in the matrix illustrated here were inverters, the elements could be transistors, contacts, diodes, resistors, NAND gates, transmission gates or similar devices. Consequently, it is intended that the claims be interpreted to cover such equivalents, so that the term elements is to be construed as covering any one or more such elements in a test matrix.

What is claimed is:

1. A method for testing the electrical analog transfer characteristics of elements in an addressable test structure produced on a wafer together with integrated circuits before dicing and packaging said integrated circuits, said method comprising the steps of developing on said wafer at least one addressable test structure having an array of probeable test contact pads, said test structure comprising a plurality of elements, addressing each element in sequence while measuring and recording the electrical transfer characteristics of each element to analog signals, and determining the extent of uniformity of said elements in respect to their electrical transfer characteristics as a test of quality of said integrated circuits produced on the same wafer as the addressable test structure before dicing.

2. A method as defined in claim 1 wherein said elements of said addressable test structure are arranged in rows and columns, and said test structure includes contact pads for addressing each column and for addressing each circuitry element in sequence out of each column selected for testing.

3. A method as defined in claim 2 wherein the electrical transfer characteristic of each element selected by said test structure is recorded on the same graph for comparison in determining the extent of uniformity of said elements in respect to their electrical transfer characteristics.

* * * * *